(12) United States Patent
Betthausen et al.

(10) Patent No.: US 12,733,314 B2
(45) Date of Patent: Sep. 8, 2026

(54) OPTOELECTRONIC SEMICONDUCTOR ELEMENT INCLUDING A CASING EMBEDDING A SEMICONDUCTOR CHIP AND WITH CRACK NUCLEI LOCATED IN THE CASING, AND METHOD FOR OPERATING SUCH AN OPTOELECTRONIC SEMICONDUCTOR ELEMENT

(71) Applicant: OSRAM Opto Semiconductors GmbH, Regensburg (DE)

(72) Inventors: Christian Betthausen, Lappersdorf (DE); Olivier Leray, Regensburg (DE); Muyuan Li, Regensburg (DE); Benjamin Gruber, Regensburg (DE); Michael Steyer, Neutraubling (DE); Alexander Linkov, JL Waalre (NL); Stefan Handl, Zell (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 612 days.

(21) Appl. No.: 17/757,579

(22) PCT Filed: Dec. 10, 2020

(86) PCT No.: PCT/EP2020/085573
§ 371 (c)(1),
(2) Date: Jun. 17, 2022

(87) PCT Pub. No.: WO2021/122321
PCT Pub. Date: Jun. 24, 2021

(65) Prior Publication Data
US 2022/0416133 A1 Dec. 29, 2022

(30) Foreign Application Priority Data
Dec. 18, 2019 (DE) ......................... 102019134904.4

(51) Int. Cl.
*H10H 20/855* (2025.01)
*H10H 20/85* (2025.01)

(52) U.S. Cl.
CPC ...... *H10H 20/855* (2025.01); *H10H 20/8506* (2025.01)

(58) Field of Classification Search
CPC .................. H01L 33/58; H01L 33/483; H01L 2933/0091; H01L 33/52
See application file for complete search history.

(56) References Cited

U.S. PATENT DOCUMENTS

| | | | |
|---|---|---|---|
| 9,209,372 | B2 | 12/2015 | Illek |
| 9,391,117 | B2 | 7/2016 | Oh et al. |

(Continued)

FOREIGN PATENT DOCUMENTS

| | | | |
|---|---|---|---|
| CN | 104396034 | A | 3/2015 |
| DE | 102012209325 | A1 | 12/2013 |
| WO | 2015124621 | A1 | 8/2015 |

OTHER PUBLICATIONS

Satterthwaite, Julian D., et al. "Effect of resin-composite filler particle size and shape on shrinkage-stress." Dental Materials 28.6 (2012): 609-614. (Year: 2012).*

(Continued)

*Primary Examiner* — Norman D Richards
*Assistant Examiner* — Ethan Edward Cutler
(74) *Attorney, Agent, or Firm* — Slater Matsil, LLP

(57) ABSTRACT

In an embodiment a method for operating an optoelectronic semiconductor component includes providing the optoelectronic semiconductor component having an optoelectronic semiconductor chip and a casing comprising a matrix material, wherein the semiconductor chip is embedded into the casing, and wherein optically inactive particles have been introduced as crack nuclei into the matrix material of the (Continued)

casing, and operating the optoelectronic semiconductor component such that cavities form entirely within the casing for at least some of the crack nuclei.

20 Claims, 4 Drawing Sheets

(56) References Cited

U.S. PATENT DOCUMENTS

| | | | |
|---|---|---|---|
| 9,741,910 B1 | 8/2017 | Haiberger et al. | |
| 2012/0037931 A1 | 2/2012 | Leung et al. | |
| 2015/0076544 A1* | 3/2015 | Schmidtke | H01L 33/56 556/19 |
| 2017/0104140 A1 | 4/2017 | Gaska et al. | |
| 2017/0222103 A1* | 8/2017 | Haiberger | H01L 33/504 |

OTHER PUBLICATIONS

Mosley, David W., et al. "High refractive index thermally stable phenoxyphenyl and phenylthiophenyl silicones for light-emitting diode applications." Journal of Applied Polymer Science 131.3 (2014). (Year: 2014).*

Chen, X., et al., "Phosphor settling induced mechanical degradation of silicone/phosphor composite in light emitting diode packages," Journal of Applied Polymer Science, J. Applpolym. Sci. 2015, DOI, 10.1002/APP 42006, Oct. 9, 2014, 8 pages.

Watzke, S., et al., "Degradation of silicone in white LEDs during device operation: a finite element approach to product reliability prediction," Osram Opto Semiconductors GmbH, 2014 15th International Conference on Thermal Mechanical and Multi-Physics Simulation and Experiments in Microelectronics and Microsystems, Apr. 2014, 5 pages.

* cited by examiner 1
31
4
35
3
2
6
61

1
5
4
5
3
2
5
4
4
6
61

OPTOELECTRONIC SEMICONDUCTOR ELEMENT INCLUDING A CASING EMBEDDING A SEMICONDUCTOR CHIP AND WITH CRACK NUCLEI LOCATED IN THE CASING, AND METHOD FOR OPERATING SUCH AN OPTOELECTRONIC SEMICONDUCTOR ELEMENT

This patent application is a national phase filing under section 371 of PCT/EP2020/085573, filed Dec. 10, 2020, which claims the priority of German patent application 10 2019 134 904.4, filed Dec. 18, 2019, each of which is incorporated herein by reference in its entirety.

TECHNICAL FIELD

An optoelectronic semiconductor component and a method of operating an optoelectronic semiconductor component are specified.

BACKGROUND

Optoelectronic semiconductor components, for example light-emitting diodes, LEDs for short, are often embedded into a casing. When silicone is used for the casing, it has been found that aging-related shrinkage of the silicone can lead to delamination of the casing from the semiconductor chip and/or from a leadframe of the semiconductor component. Results of this can include impairment of corrosion resistance and brightness of the semiconductor component.

SUMMARY

Embodiments provide a semiconductor component notable for good aging characteristics coupled with good optoelectronic properties.

Embodiments provide an optoelectronic semiconductor component comprising at least one optoelectronic semiconductor chip.

The optoelectronic semiconductor component may also have more than one optoelectronic semiconductor chip. The optoelectronic semiconductor chip is envisaged for generation and/or reception of radiation, for example for radiation in the ultraviolet, visible or infrared spectral region.

For example, the semiconductor chip, especially an active region thereof, includes a III-V compound semiconductor material. III-V compound semiconductor materials are particularly suitable for generation of radiation in the ultraviolet (Alx Iny Ga1 x y N) through the visible (Alx Iny Ga1 x y N, especially for blue to green radiation, or Alx Iny Ga1 x y P, especially for yellow to red radiation) into the infrared (Alx Iny Ga1 x y As) spectral region. In each case here, $0 \leq x \leq 1$, $0 \leq y \leq 1$ and $x+y \leq 1$, especially with $x \neq 1$, $y \neq 1$, $x \neq 0$ and/or $y \neq 0$. III-V compound semiconductor materials, especially composed of the material systems mentioned, can also achieve high internal quantum efficiencies in the generation of radiation.

In at least one embodiment of the optoelectronic semiconductor component, the optoelectronic semiconductor component has a casing into which the semiconductor chip is embedded. The casing, for example, directly adjoins the optoelectronic semiconductor chip in places.

The casing is produced, for example, by a casting method. A casting method is generally understood to mean a method by which a molding compound can be configured and, if required, cured in a predefined form. More particularly, the term "casting method" encompasses molding, film-assisted molding, injection molding, transfer molding and compression molding.

In at least one embodiment of the optoelectronic semiconductor component, the casing includes a matrix material. The matrix material is appropriately transparent to the radiation to be generated and/or received by the optoelectronic semiconductor chip.

The transparent matrix material in particular may include, for example, siloxanes, epoxides, acrylates, methyl methacrylates, imides, carbonates, olefins, styrenes, urethanes or derivatives thereof in the form of monomers, oligomers or polymers, and additionally also mixtures, copolymers or compounds therewith. For example, the matrix material may comprise or be an epoxy resin, polymethylmethacrylate (PMMA), polystyrene, polycarbonate, polyacrylate, polyurethane, a silicone or a silicone resin, for instance polysiloxane or mixtures thereof.

In at least one embodiment of the optoelectronic semiconductor component, the material includes or consists of a silicone.

In at least one embodiment of the optoelectronic semiconductor component, the casing is formed such that cavities form in operation of the optoelectronic semiconductor component. The cavities are entirely within the casing. The cavities especially form only in operation of the optoelectronic semiconductor component. Immediately after the production of the optoelectronic semiconductor component, the cavities thus do not yet exist in the casing. More particularly, the number of cavities can increase at least within a particular period of operation with increasing duration of operation of the optoelectronic semiconductor component.

In at least one embodiment of the optoelectronic semiconductor component, the optoelectronic semiconductor component includes an optoelectronic semiconductor chip and a casing with a matrix material, wherein the semiconductor chip is embedded into the casing and wherein the casing is formed in such a way that cavities entirely within the casing form in operation of the optoelectronic semiconductor component.

The casing is thus deliberately formed such that cavities form in the casing in operation of the semiconductor component. The cavities are fully surrounded by the material of the casing and do not extend up to an outer surface of the casing. In other words, the cavities do not form pathways via which air and/or moisture, for example, can get to the semiconductor chip.

The outer surface of the casing is, for example, an interface of the casing with another part of the semiconductor component, for example with the semiconductor chip and/or casing body and/or leadframe of the casing body. In addition, the outer surface of the casing may conclude the semiconductor component in some places. This means that the outer surface of the casing is also an outer face of the semiconductor component in some places.

It has been found that such enclosed cavities have the effect of reducing delamination forces that lead to detachment of the casing from the semiconductor chip or another part of the semiconductor component. In other words, the cavities have the effect that stresses in the casing are dissipated and delamination forces are reduced.

In at least one embodiment of the optoelectronic semiconductor component, the casing is formed in such a way that aging-related shrinkage of the matrix material brings about the formation of cavities. More particularly, the material composition of the casing is such that the cavities form in operation of the optoelectronic semiconductor component.

This can achieve the effect that the casing remains stuck to the semiconductor chip and/or the other parts of the optoelectronic semiconductor component that adjoin the casing in operation of the optoelectronic semiconductor component, even when the matrix material shrinks as a result of aging. The risk that cracks will form at the interface between the casing and the semiconductor chip and/or other parts of the semiconductor component is avoided or at least reduced.

In at least one embodiment of the optoelectronic semiconductor component, particles are introduced as crack nuclei into the matrix material of the casing, such that the cavities form at least at some of the crack nuclei in operation of the optoelectronic semiconductor component. The particles thus serve as a starting point for the formation of the cavities, for instance in the form of microcracks. For example, the cavities in any direction of maximum extent, have an extent of not more than 100 μm or not more than 50 μm. Alternatively or additionally, the cavities in any direction of maximum extent have an extent of at least 5 μm or at least 10 μm.

In at least one embodiment of the optoelectronic semiconductor component, the particles are transparent to the radiation to be generated and/or to be received by the optoelectronic semiconductor chip. More particularly, the particles absorb the radiation only in a negligible proportion, if at all.

In at least one embodiment of the optoelectronic semiconductor component, particles are optically inactive. What this means is more particularly that the particles are not intended to form the spatial and/or spectral emission characteristics of the optoelectronic semiconductor component. More particularly, the particles are not diffusers nor luminophores. In other words, the casing comprising such particles essentially has the same optical properties as a casing lacking any such particles.

In at least one embodiment of the optoelectronic semiconductor component, the particles are formed by a material matched in terms of refractive index to a refractive index of the matrix material. Preferably, the refractive index of the material of the particles varies by not more than 10%, more preferably by not more than 5%, from the refractive index of the matrix material. The smaller the difference in refractive index between the material of the particles and the matrix material, the smaller optical interfacial effects will be, for example refraction effects.

For avoidance of doubt, the reflective indices each relate to the refractive index of the materials at room temperature.

In at least one embodiment of the optoelectronic semiconductor component, at least some of the particles have an angular basic form. The particles are thus not entirely rotationally symmetric. It has been found that edges of the particles act particularly efficiently as crack nuclei. For example, a maximum extent of at least some of the particles in one direction is at least 10% greater than a diameter of an ideal spherical particle having the same volume.

In at least one embodiment of the optoelectronic semiconductor component, the particles have an average diameter between 5 μm and 30 μm inclusive. In the case of nonspherical particles, the maximum extent is considered here to be the diameter. The diameter of the particles is thus high compared to a wavelength of maximum intensity of the radiation to be generated and/or received.

In at least one embodiment of the optoelectronic semiconductor component, the particles are present in the casing in a proportion between 3% by weight and 30% by weight inclusive, especially in a proportion between 5% by weight and 25% by weight inclusive. In the case of too low a proportion of particles, the cavities are not generated with sufficient density in the casing. In the case of too high a proportion, the particles cause an excessive increase in the viscosity of the material of the casing, which complicates processing in the production of the optoelectronic semiconductor component.

In at least one embodiment of the optoelectronic semiconductor component, the matrix material is a silicone. The matrix material is preferably what is called a high-refraction silicone having a refractive index between 1.52 and 1.6 inclusive, especially between 1.54 and 1.56 inclusive.

A high-refraction silicone can reduce the difference in refractive index between the optoelectronic semiconductor chip and the casing. This improves the optical coupling of the optoelectronic semiconductor chip to the casing. In the case of a radiation-generating optoelectronic semiconductor chip, there is thus an improvement in outcoupling efficiency.

In principle, however, high-refraction silicone has a greater tendency to delamination than low-refraction silicone.

With the above-described configuration of the casing, however, it is also possible to reliably form a casing based on high-refraction silicone as matrix material in such a way that high aging stability can be achieved. High aging stability and good coupling of the semiconductor chip to the casing can thus be combined.

In principle, however, it is also possible to use a low-refraction silicone, for example a silicone having a refractive index between 1.4 and 1.5 inclusive, especially between 1.45 and 1.48 inclusive.

In at least one embodiment of the optoelectronic semiconductor component, the matrix material has a refractive index of between 1.4 and 1.6 inclusive. For example, the matrix material includes a polymer material or a hybrid material.

In at least one embodiment of the optoelectronic semiconductor component, the casing includes a luminophore in addition to the particles. The luminophore is intended to convert primary radiation generated by the optoelectronic semiconductor chip fully or partly to secondary radiation having a wavelength range at least partly different than the primary radiation. For example, the primary radiation is in the blue or ultraviolet spectral region, and the secondary radiation in the red, yellow, green or blue spectral region. For example, the optoelectronic semiconductor component emits mixed light having an overall white appearance to the human eye.

The luminophore here may include one or more of following materials: garnets of the rare earths and the alkaline earth metals, for example YAG:Ce3+, nitrides, nitridosilicates, siones, sialones, aluminates, oxides, halophosphates, orthosilicates, sulfides, vanadates and chlorosilicates. In addition, the luminophore may additionally or alternatively comprise an organic material that may be selected from a group comprising perylenes, benzopyrenes, coumarins, rhodamines and azo dyes. The casing may include suitable mixtures and/or combinations of the luminophores mentioned. In this way, it may be possible, for example, that, as described above, the casing absorbs in a blue first wavelength region and emits in a second wavelength region having green and red wavelengths and/or yellow wavelength regions.

Additionally specified is a method of operating an optoelectronic semiconductor component.

In at least one embodiment of the method of operating an optoelectronic semiconductor component, an optoelectronic semiconductor component comprising an optoelectronic semiconductor chip and a casing comprising a matrix material is provided, wherein the semiconductor chip is embedded into the casing. The optoelectronic semiconductor component is operated in such a way that cavities entirely within the casing are formed.

The optoelectronic semiconductor component is thus deliberately operated in such a way that the cavities form in the casing. This appropriately proceeds in regular operation of the optoelectronic semiconductor component. It is thus not necessary for this purpose to provide a separate production step or an additional mode of operation for this purpose. The risk of delamination of the casing during operation can be avoided or at least reduced by the formation of the cavities, especially without lowering the power consumption of the optoelectronic semiconductor component, at least averaged over time.

An optoelectronic semiconductor component having one or more features of the above-described optoelectronic semiconductor component is especially suitable for the method of operation. Features described in connection with the optoelectronic semiconductor component may therefore also be used for the method of operation and vice versa.

BRIEF DESCRIPTION OF THE DRAWINGS

Further configurations and expediencies are apparent from the description of the working examples in conjunction with the figures that follows.

The figures show.

DETAILED DESCRIPTION OF ILLUSTRATIVE EMBODIMENTS

Figure 1A:
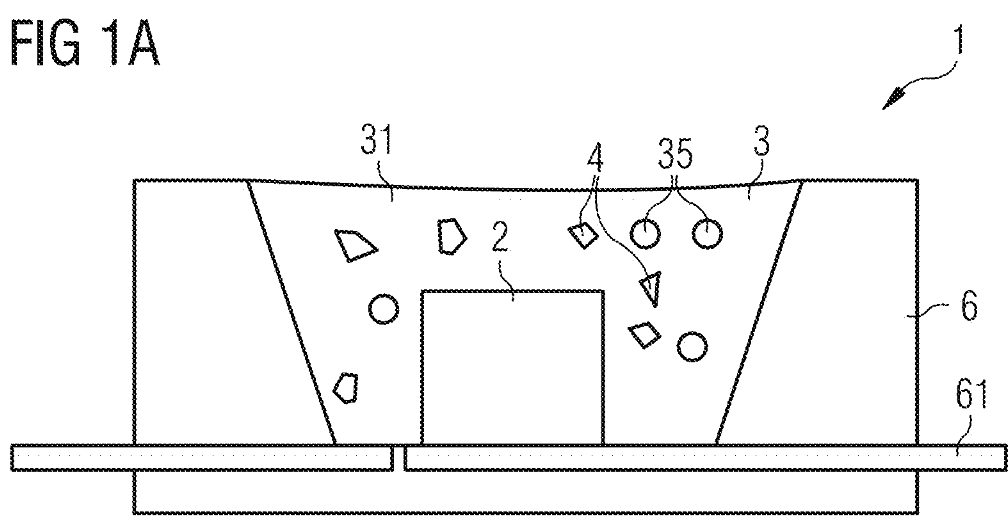
FIGS. 1A and 1B: a working example of a semiconductor component and a method of operation of a semiconductor component by diagrams in schematic section view immediately after production (FIG. 1A) and after a given duration of operation (FIG. 1B)

Elements that are the same, of the same type or have the same effect are given the same reference numerals in the figures.

The figures are each schematic diagrams and are therefore not necessarily true to scale. Instead, comparatively small elements and especially layer thicknesses may be shown in excessively large size for illustration.

The optoelectronic semiconductor component according to the working example shown in FIG. 1A has an optoelectronic semiconductor chip 2 in the form, for example, of an LED semiconductor chip. The optoelectronic semiconductor chip 2 is embedded in a casing 3.

In the working example shown, the semiconductor chip 2 is in a cavity of a housing body 6 and is externally electrically contactable via a leadframe 61. However, the described configuration of the casing 3 is fundamentally suitable for any kind of housings in which an optoelectronic semiconductor chip is embedded into a casing 3, especially one that is radiation-transparent.

Figure 1B:
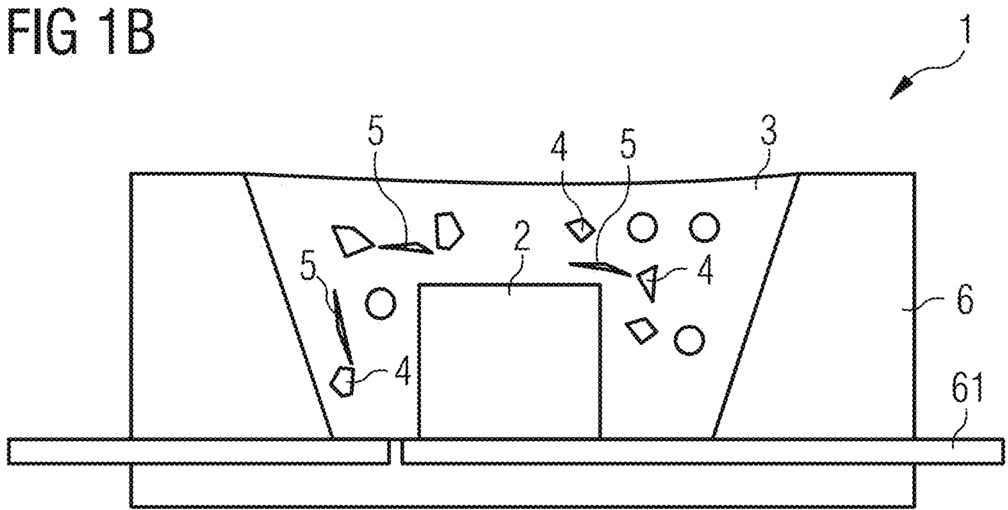

The casing 3 is formed such that cavities 5 entirely within the casing 3 are formed in operation of the optoelectronic semiconductor component. This is shown in schematic form in FIG. 1B. The semiconductor component 1 is thus deliberately operated in such a way that the cavities 5 form within the casing 3, especially in the form of microcracks.

By means of the cavities 5, it is possible to achieve reduction of stresses that could lead to delamination of the casing 3 from the semiconductor chip 2 or parts of the housing body 6, for example of the leadframe 61.

Figure 2A:
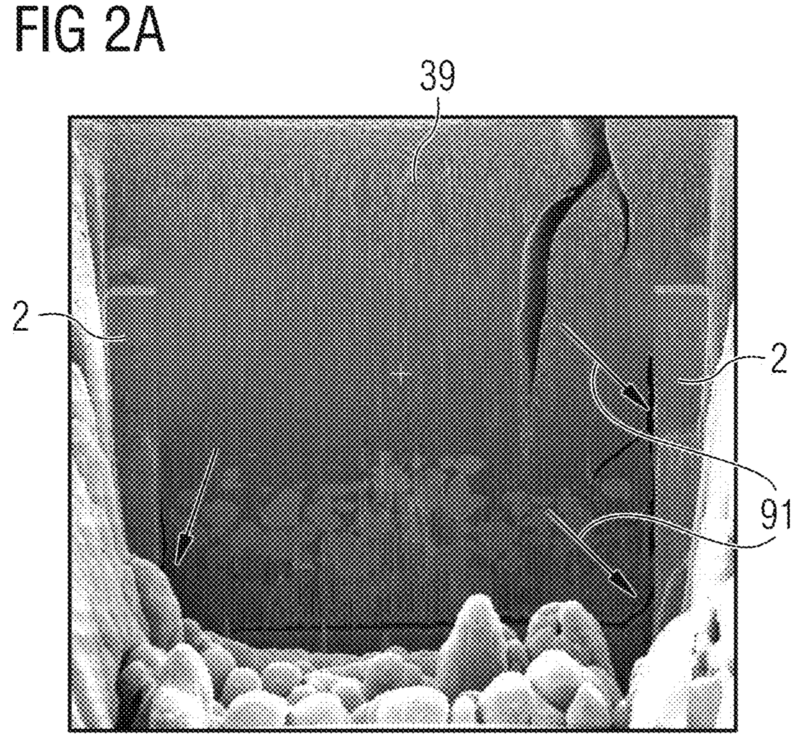
FIG. 2A: a scanning electron micrograph of a reference sample with delaminated reference casing.
Figure 2B:
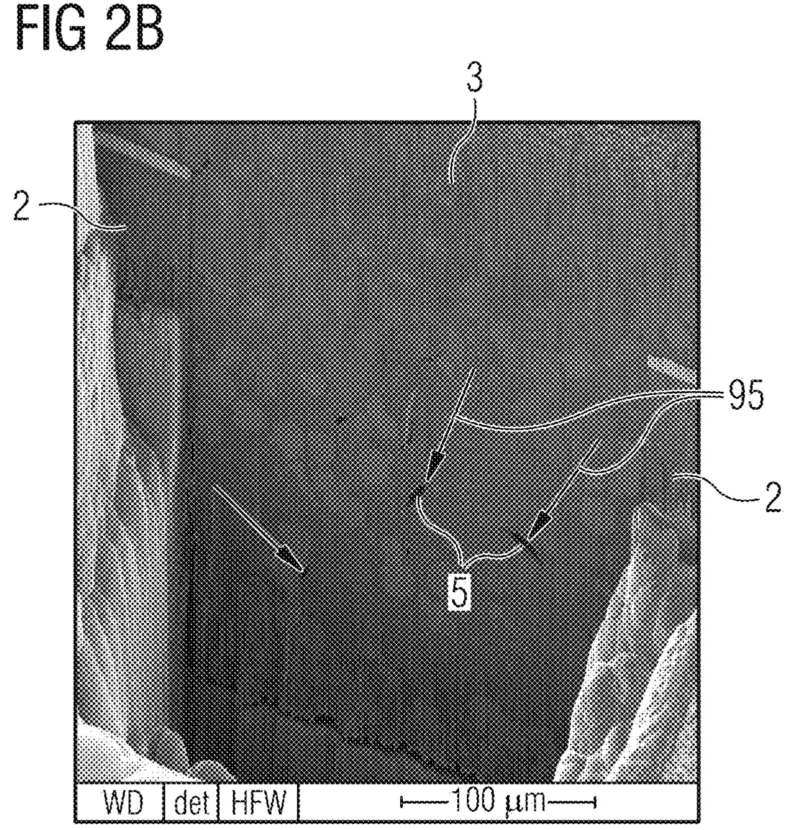
FIG. 2B: a scanning electron micrograph of a section through an above-described semiconductor component with a casing having cavities.

This becomes clear from the scanning electron micrographs shown in FIGS. 2A and 2B. In the case of a conventional reference casing 39, aging-related shrinkage of the reference casing can have the effect that the reference casing 39 becomes detached in places from the semiconductor chip 2. This is apparent in FIG. 2A at sites indicated by the arrows 91.

By contrast, the cavities 5 in the casing 3 that are indicated by the arrows 95 in FIG. 2B show that the casing 3 remains firmly bonded to the semiconductor chip 2 and the housing body 6.

Gaps between the casing 3 and a semiconductor chip 2, for example on account of corrosion effects, could lead to a reduction in brightness of the radiation emitted by the optoelectronic semiconductor component 1. The optical coupling of the optoelectronic semiconductor chip 2 to the casing 3 can also be impaired by such a gap, which likewise leads to a reduction in brightness.

Figure 3A:
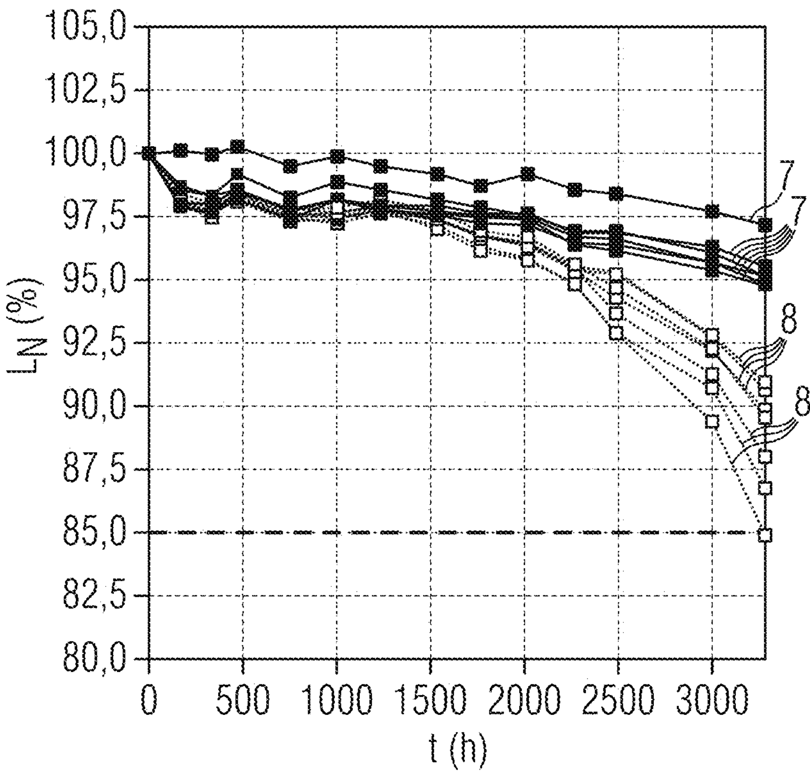
FIGS. 3A and 3B: measurement results for measurements of normalized luminous flux LN in percent, normalized to the luminous flux at time t=0 (also as lumen maintenance/$\Phi_{\square}$) in FIG. 3A and the change in color locus (also color shift) $\Delta v'$ in pts compared to time t=0 in FIG. 3B in above-described semiconductor components and in reference samples as a function of duration of operation t in hours.
Figure 3B:
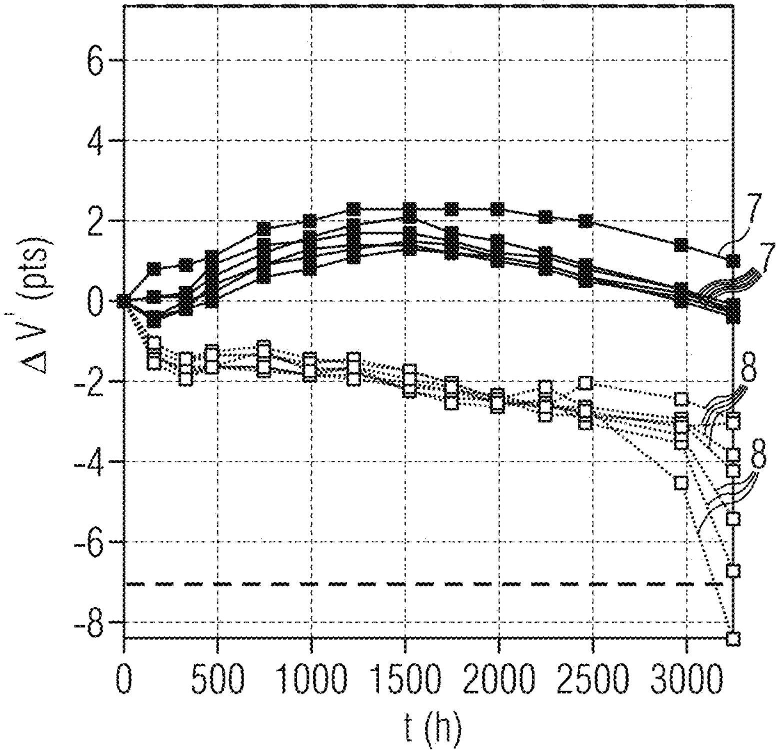

In addition, this can also result in a shift in color locus of the radiation emitted by the semiconductor component overall. This is shown in FIGS. 3A and 3B. The measurements demonstrate that the drop in brightness for semiconductor components with the above-described casing, shown by the curves 7, is much smaller than for the reference curves 8. The change in color locus, as shown in FIG. 3B, is also much greater for the reference curves 8.

Figure 4A:
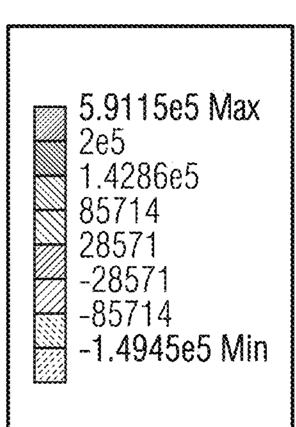
FIGS. 4A and 4B: simulation results of delamination warpage assuming a casing having six cavities (FIG. 4A) or 18 cavities (FIG. 4B).
Figure 4A:
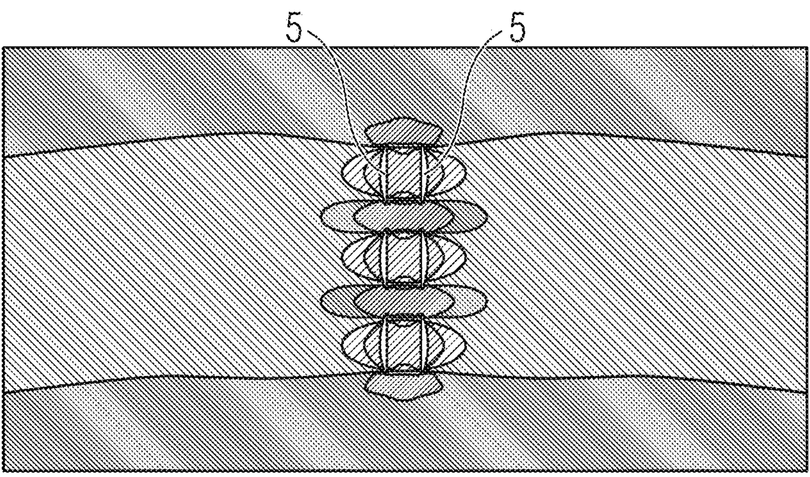
Figure 4B:
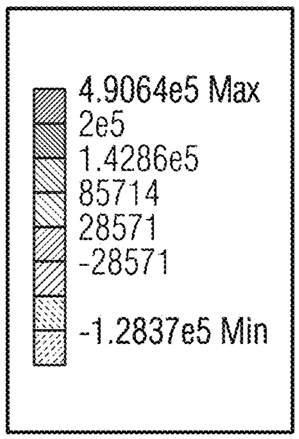
Figure 4B:
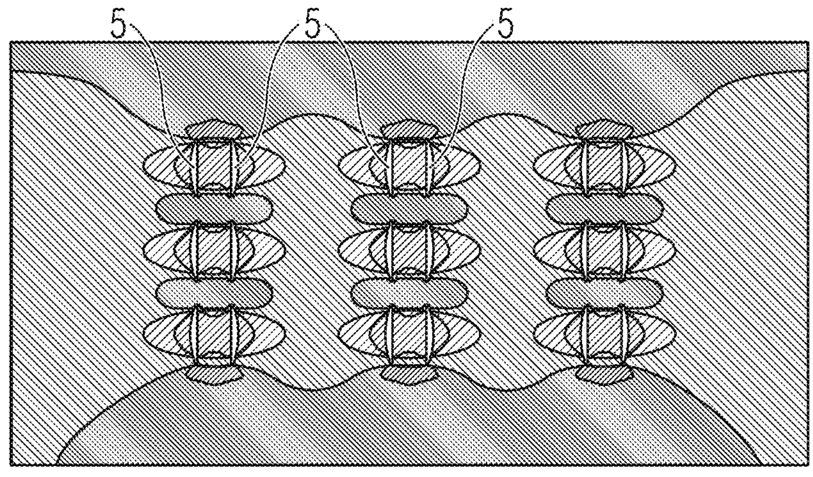

FIGS. 4A and 4B show results of simulations of the delamination stress that occurs. The basis used for this purpose was a casing having a cross section of 150 μm×250 μm. In addition, aging-related shrinkage of 4.5% was estimated for the casing 3. For a conventional homogeneous casing, i.e. a reference casing without cavities, this results in a delamination stress of 0.154 MPa.

FIGS. 4A and 4B show simulations in which, rather than a homogeneous conventional shell, six cavities (FIG. 4A) or 18 cavities (FIG. 4B) were assumed, with the cavities each having a length of 20 μm. According to simulation results, a reduced delamination stress of 0.139 MPa is found in the case of six cavities, and an even more significantly reduced delamination stress of 0.109 MPa for the case with 18 cavities. The simulations thus demonstrate that the cavities have a positive effect on delamination stress and hence promote the aging stability of the semiconductor component 1 overall.

A suitable matrix material 31 for the casing 3 is, for example, one that includes a silicone or consists of a silicone. Especially suitable is a highly refractive silicone, for example having a refractive index between 1.54 and 1.56. In principle, however, it is also possible to employ another one of the matrix materials mentioned in the general part of the description.

It is possible to introduce particles 4 into the matrix material 31 of the casing that serve as crack nuclei and promote the formation of cavities in the casing. Suitable materials for the particles are in principle all of those that are transparent to the radiation to be generated or received by the optoelectronic semiconductor chip. The particles 4 are preferably formed by a material which, in terms of refractive index, differs only slightly, if at all, from the refractive index of the matrix material 31. The refractive indices preferably differ from one another by not more than 10%, more preferably by not more than 5%. For example, the particles contain an oxide, for instance silicon dioxide.

Examples that are alternatively suitable for the particles include an acrylate, for instance polymethylmethacrylate (PMMA), an imide, for example poly(methylmethacrylimide) (PMMI), or a glass.

The particles 4 preferably have an average diameter between 5 μm and 30 μm inclusive.

It has additionally been found that particles 4 having an angular basic form act particularly efficiently as crack nuclei for the formation of cavities 5 in the casing 3. In principle, however, it is also possible to employ spherical particles.

The particles 4 are preferably present in the casing 3 in a proportion of at least 3% by weight, preferably at least 5% by weight. This reliably ensures that, on account of the aging-related shrinkage of the matrix material, sufficient cavities 5 are formed in the casing 3.

Appropriately, the particles 4 are present in the casing in a proportion of not more than 30%, especially not more than 25% by weight. This ensures that the casing is not too viscous in the production of the semiconductor component 1.

In addition, a luminophore 35 may also be disposed within the casing 3, such that the semiconductor component 1 produces mixed radiation overall, for example mixed light that appears white to the human eye.

The described configuration of the casing 3 is especially suitable for optoelectronic semiconductor components 1 where high light outputs are required in the continuous wave sector, as a result of which comparatively high temperatures occur in the casing 3. As a result, in the case of such optoelectronic semiconductor components 1, there is an elevated risk of delamination effects on account of aging-related shrinkage of the matrix material. In the case of such optoelectronic semiconductor components 1, high aging stability of the semiconductor components can be achieved, especially with regard to brightness and color locus of the radiation emitted, without having to reduce the power consumption of the optoelectronic semiconductor component.

In principle, however, the casing described is suitable for all kinds of optoelectronic semiconductor components, especially also for optoelectronic semiconductor chips 2 intended to receive radiation.

The invention is not limited by the description with regard to the working examples. Instead, the invention encompasses any new feature and any combination of features, which especially include any combination of features in the patent claims, even if this feature or this combination itself is not exclusively specified in the patent claims or working examples.

The invention claimed is:

1. An optoelectronic semiconductor component comprising:

an optoelectronic semiconductor chip;

a casing comprising a matrix material; and optically inactive particles being crack nuclei located in the matrix material of the casing, wherein the optoelectronic semiconductor chip is embedded in the matrix material of the casing, wherein, during operation of the optoelectronic semiconductor component and based on the crack nuclei, cavities form entirely within the matrix material of the casing and outside the particles at least at some of the particles, wherein the particles comprise titanium carbide (TiC) having a particle size between 50 nm and 2 μm, wherein the matrix material comprises polyurethane, and wherein the cavities that form during operation have dimensions between 10 nm and 200 nm and are configured to scatter light primarily in an infrared wavelength range above 700 nm.

2. The optoelectronic semiconductor component of claim 1, wherein aging-related shrinkage of the matrix material causes formation of the cavities.

3. The optoelectronic semiconductor component of claim 1, wherein the particles are transparent to a radiation generated or received by the optoelectronic semiconductor chip.

4. The optoelectronic semiconductor component of claim 1, wherein a refractive index of a material of the particles matches a refractive index of the matrix material.

5. The optoelectronic semiconductor component of claim 4, wherein the refractive index of the material of the particles varies by not more than 10% from the refractive index of the matrix material.

6. The optoelectronic semiconductor component of claim 4, wherein the refractive index of the material of the particles varies by not more than 5% from the refractive index of the matrix material.

7. The optoelectronic semiconductor component of claim 1, wherein at least some of the particles have an angular basic form.

8. The optoelectronic semiconductor component of claim 1, wherein the particles have an average diameter between 5 μm and 30 μm, inclusive.

9. The optoelectronic semiconductor component of claim 1, wherein the particles are present in the casing with a proportion between 3% by weight and 30% by weight inclusive.

10. The optoelectronic semiconductor component of claim 1, wherein the particles are present in the casing with a proportion between 5% by weight and 25% by weight inclusive.

11. The optoelectronic semiconductor component of claim 1, wherein the matrix material is silicone.

12. The optoelectronic semiconductor component of claim 1, wherein the matrix material has a refractive index of between 1.4 and 1.6, inclusive.

13. A method for operating an optoelectronic semiconductor component comprising an optoelectronic semiconductor chip and a casing comprising a matrix material, wherein the optoelectronic semiconductor chip is embedded in the matrix material of the casing, and wherein optically inactive particles being crack nuclei are located in the matrix material of the casing, the method comprising:

operating the optoelectronic semiconductor component such that, based on the crack nuclei, cavities form outside the particles and entirely within the matrix material of the casing for at least some of the particles, wherein the particles comprise titanium carbide (TiC) having a particle size between 50 nm and 2 μm, wherein the matrix material comprises polyurethane, and wherein the formed cavities have dimensions between 10 nm and 200 nm and are configured to scatter light primarily in an infrared wavelength range above 700 nm.

14. An optoelectronic semiconductor component comprising:

an optoelectronic semiconductor chip;

a casing comprising a matrix material; and optically inactive particles being crack nuclei located in the matrix material of the casing, wherein the optoelectronic semiconductor chip is embedded into the matrix material of the casing, wherein at least some of the particles are configured to form cavities outside the particles and entirely within the matrix material of the casing, wherein the particles comprise a material having a coefficient of thermal expansion that differs from the coefficient of thermal expansion of the matrix material by at least $50\times10^{-6}$/K, such that thermal cycling during operation of the optoelectronic semiconductor chip causes differential thermal stress between the particles and the matrix material, thereby initiating crack formation at interfaces between the particles and the matrix material, and wherein the cracks propagate into the matrix material to form the cavities entirely within the matrix material.

15. The optoelectronic semiconductor component of claim 14, wherein the casing is configured to form the cavities based on aging-related shrinkage of the matrix material.

16. The optoelectronic semiconductor component of claim 1, wherein the particles are not diffusers.

17. The optoelectronic semiconductor component of claim 1, wherein the particles are not luminophores.

18. An optoelectronic semiconductor component comprising:

an optoelectronic semiconductor chip;

a casing comprising a matrix material; and optically inactive particles being crack nuclei located in the matrix material of the casing, wherein the optoelectronic semiconductor chip is embedded in the matrix material of the casing, wherein, during operation of the optoelectronic semiconductor component and based on the crack nuclei, cavities form entirely within the matrix material of the casing and outside the particles at least at some of the particles, wherein the particles comprise a material having a coefficient of thermal expansion that differs from the coefficient of thermal expansion of the matrix material by at least $50\times10^{-6}$/K, such that thermal cycling during operation of the optoelectronic semiconductor chip causes differential thermal stress between the particles and the matrix material, thereby initiating crack formation at interfaces between the particles and the matrix material, and wherein the cracks propagate into the matrix material to form the cavities entirely within the matrix material.

19. The optoelectronic semiconductor component of claim 18, wherein aging-related shrinkage of the matrix material causes formation of the cavities.

20. The optoelectronic semiconductor component of claim 19, wherein a refractive index of the material of the particles varies by not more than 5% from a refractive index of the matrix material.

* * * * *